(12) United States Patent
Oyama et al.

(10) Patent No.: US 7,094,994 B2
(45) Date of Patent: Aug. 22, 2006

(54) HEAT TREATMENT APPARATUS AND METHOD OF SEMICONDUCTOR WAFER

(75) Inventors: Kenichi Oyama, Kanagawa (JP); Atsushi Someya, Kanagawa (JP); Yuko Yamaguchi, Kanagawa (JP)

(73) Assignee: Sony Corporation, (JP)

( * ) Notice: Subject to any disclaimer, the term of this patent is extended or adjusted under 35 U.S.C. 154(b) by 142 days.

(21) Appl. No.: 10/795,347

(22) Filed: Mar. 9, 2004

(65) Prior Publication Data
US 2004/0226936 A1 Nov. 18, 2004

(30) Foreign Application Priority Data
Mar. 11, 2003 (JP) ............................ P2003-064402

(51) Int. Cl.
*H05B 3/68* (2006.01)
*H05B 3/02* (2006.01)
*C23C 16/00* (2006.01)

(52) U.S. Cl. ................... 219/444.1; 118/724; 219/483
(58) Field of Classification Search ............. 219/443.1, 219/444.1, 390, 476, 477, 483, 489, 508–510; 392/416, 418; 118/724, 725
See application file for complete search history.

(56) References Cited

U.S. PATENT DOCUMENTS

| | | | | |
|---|---|---|---|---|
| 5,294,778 A | * | 3/1994 | Carman et al. ............. | 219/385 |
| 5,580,607 A | * | 12/1996 | Takekuma et al. .......... | 427/240 |
| 6,311,091 B1 | * | 10/2001 | Yamahira ..................... | 700/11 |
| 6,402,509 B1 | * | 6/2002 | Ookura et al. .............. | 432/253 |

* cited by examiner

*Primary Examiner*—Sang Paik
(74) *Attorney, Agent, or Firm*—Rader, Fishman & Grauer PLLC; Ronald P. Kananen

(57) ABSTRACT

A semiconductor wafer heat treatment apparatus and method, which can carry out a heat treatment to suppress variations in line widths within a surface on a semiconductor wafer and the like, includes: a heating plate for heating a semiconductor wafer to a predetermined temperature; a temperature measuring unit for measuring temperatures when heating the semiconductor wafer or a semiconductor wafer equivalent placed on the heating plate, at portions divided into a plurality of regions; and a controller for controlling the temperatures of the semiconductor wafer, and based on the temperature measurement result of the temperature measuring unit, the controller controls the temperature in heating the semiconductor wafer, for each of the plurality of regions. In cooling after the heating process, based on the temperature measurement result, the controller controls the temperature in cooling the semiconductor wafer, for each of the plurality of regions.

9 Claims, 8 Drawing Sheets

20 21 24

HEAT TREATMENT APPARATUS AND METHOD OF SEMICONDUCTOR WAFER

CROSS REFERENCES TO RELATED APPLICATIONS

The present document is based on Japanese Priority Document JP 2003-064402, filed in the Japanese Patent Office on Mar. 11, 2003, the entire contents of which being incorporated herein by reference.

BACKGROUND OF THE INVENTION

1. Field of the Invention

The present invention relates to a heat treatment apparatus and a heat treatment method of a semiconductor wafer, and relates more particularly to a heat treatment apparatus and a heat treatment method of a semiconductor wafer that is used in a manufacturing step of a semiconductor device, such as a PEB (Post Exposure Bake) processing step of a resist film of a chemically amplified type and the like.

2. Description of Related Art

In the manufacturing step of a semiconductor device, the photolithography technique for forming a pattern of photoresist film has become more and more important in order to attain the further hyperfine structure of the semiconductor device.

For example, in a case of a resist film of the chemically amplified type, the heat treatment referred to as the PEB process is carried out before a developing process is carried out after a process for exposing the resist film. This is carried out in order that acid generated in an exposed region is amplified by the heat treatment, thereby obtaining an exposed line width.

FIG. 5 is a diagrammatically configurative view showing a heat treatment apparatus for carrying out the heat treatment such as the above-mentioned PEB process and the like.

A heating plate 100 for heating the semiconductor wafer, for example, on which the resist film of the chemically amplified type is formed and which is exposed to a predetermined pattern, to a predetermined temperature contains therein heaters 101 divided into, for example, seven regions.

A power supply switch 102 through which a temperature can be set is connected to the respective heaters 101. By turning on the switch, the heating plate 100 is heated to a preset temperature (for example, 130° C.).

In order to use the above-mentioned heat treatment apparatus and perform the PEB process on the semiconductor wafer, for example, at the power supply switch 102, the temperature is set at 130° C., and the semiconductor wafer after the exposure is placed on the heating plate 100 heated to the set temperature after the switch is turned on. Then, the heat treatment of a predetermined time period is performed on the semiconductor wafer. The heat treatment period may be, for example, 90 seconds.

Then, after the elapse of this heat treatment period, the semiconductor wafer is cooled for 60 to 90 seconds and cooled to a normal temperature of about 23° C. (refer to a patent document 1) following hereto. At this time, the semiconductor wafer is cooled by moving the semiconductor wafer from the heating plate 100 onto a cooling plate (not shown) that contains therein a water cooled tube.

[Patent Document 1]

Japanese Patent Application Laid Open (JP-A 2001-23893) (Especially, Paragraph Number 0033)

However, when the above-mentioned heat treatment apparatus is used to carry out the PEB process, a tolerance of variation in a line width is previously large, with regard to the line width of the resist film generated as the result of the execution of the PEB process. Thus, the variation in the temperature of the PEB process is not especially considered, which leads to a problem in controllability of the line width within the surface on the semiconductor wafer. In particular, the problem that the above-mentioned conventional heat treatment apparatus can not suppress the variation in the line width becomes severe toward the hyperfine structure on and after the 0.1 µm-generation.

For example, FIG. 6 is a profile of the temperature variations in the PEB process. The vertical axis indicates the values of the temperature variations, and the horizontal axis indicates the process time.

Temperature variations in an initial period of the PEB process between 0 and about 20 seconds are temperature variations when it is heated to a predetermined temperature, and temperature variations on and after 90 seconds are temperature variations when it is cooled from the temperature of the PEB process.

FIGS. 7A to 7C are views in which the temperatures in the PEB process measured at the respective positions of the semiconductor wafer are plotted. FIG. 7A shows a period between 0 and about 20 seconds during which the temperature rises, and FIG. 7B shows a period between about 20 and 90 seconds during which the temperature is stable in the predetermined PEB processing temperatures, and FIG. 7C shows a period of cooling down on and after 90 seconds, respectively.

They are measured from the center of the semiconductor wafer to the outer circumference thereof, and the respective measured points are all plotted. Thus, the profile has the width corresponding to the variation in the temperatures.

For example, the width of the temperature variation in the temperature rising period is 21.2° C., the width of the temperature variation in the over-shooting region immediately after the temperature has risen is 1.56° C., and the width of the temperature variation in the stable temperature period at the end point (90 seconds) in the PEB process is 0.2° C. Also, the width of the temperature variation in the cooling period is greater than that of the temperature rising period.

For example, in the temperature rising period of FIG. 7A, the outer circumference is higher in temperature than the center of the semiconductor wafer, and in the cooling period of FIG. 7C, the center is higher in temperature than the outer circumference of the semiconductor wafer, as a tendency thereof.

As mentioned above, it is understood that the PEB process has the variation in the processing temperatures within the surface on the semiconductor wafer and that the variation is greater in particular in the temperature rising period and the cooling period of the process.

FIG. 8A is a graph showing a line width when the PEB processing temperature is the highest temperature in an isolated pattern having a line width of 70 nm and a line width (CD (Critical Dimension) value) when it is the lowest temperature, which are calculated from a simulation. Under a proper dose amount, the difference between the line widths reaches 6.8 nm.

Also, FIG. 8B is a graph showing a line width when the PEB processing temperature is the highest temperature in a pattern of a line space of a line width of 90 nm and a line width (CD value) when it is the lowest temperature, which are calculated from the simulation. Under the proper dose amount, the difference between the line widths reaches 9.9 nm.

As mentioned above, in the PEB process based on a conventional method, the variation in the PEB processing temperatures within the surface on the semiconductor wafer is severe. Thus, it is desired to carry out the heat treatment while suppressing the variation.

Also, suppressing of the variation is required not only in the PEB process. For example, even for another heat treatment to be performed on the resist film, such as a pre-baking process for evaporating solvent in the resist film after the formation of the resist film and the like, or the heat treatment using a heating plate which is performed on the semiconductor wafer, it is similarly desired to carry out the heat treatment while suppressing the variation in them within the surface on the semiconductor wafer.

The present invention is accomplished in view of the above-mentioned problems. Accordingly, there has been a need to provide a heat treatment apparatus and a heat treatment method of a semiconductor wafer, which can carry out a heat treatment so as to suppress variations in line widths within a surface on a semiconductor wafer and the like.

SUMMARY OF THE INVENTION

In order to attain the above-mentioned need, a semiconductor wafer heat treatment apparatus according to a first aspect of the present invention includes: a heating plate for heating a semiconductor wafer to a predetermined temperature; a temperature measuring unit for measuring temperatures of a semiconductor wafer or semiconductor wafer equivalent placed on the heating plate at portions preliminarily divided into a plurality of regions; and a controller for controlling the temperatures of the semiconductor wafer, and in accordance with the result of the temperatures measured by the temperature measuring unit, the controller controls the temperature when the semiconductor wafer is heated, for each of the plurality of regions.

Also, in order to accomplish the above-mentioned need, a semiconductor wafer heat treatment apparatus according to a second aspect of the present invention includes: a heating plate for heating a semiconductor wafer to a predetermined temperature; a cooling plate for cooling the semiconductor wafer heated to the predetermined temperature; a temperature measuring unit for measuring the temperatures when a semiconductor wafer or semiconductor wafer equivalent placed on the cooling plate is cooled, at portions preliminarily divided into a plurality of regions; and a controller for controlling the temperatures of the semiconductor wafer, and in accordance with a result of the temperatures measured by the temperature measuring unit, the controller controls the temperature when the semiconductor wafer is cooled, for each of the plurality of regions.

Also, in order to accomplish the above-mentioned need, a semiconductor wafer heat treatment apparatus according to a third aspect of the present invention includes both of the members included by the semiconductor wafer heat treatment apparatuses according to the above-mentioned first and second embodiments.

Also, in order to accomplish the above-mentioned need, a semiconductor wafer heat treatment method according to a fourth aspect of the present invention is a semiconductor wafer heat treatment method of heating a semiconductor wafer, and includes the steps of: placing a semiconductor wafer equivalent on a heating plate, and measuring temperatures when heating the semiconductor wafer equivalent, at portions preliminarily divided into a plurality of regions; and placing a semiconductor wafer on the heating plate, and heating the semiconductor wafer while controlling the temperature when heating the semiconductor wafer, for each of the plurality of regions, in accordance with a measured result of the temperatures.

Also, in order to accomplish the above-mentioned need, a semiconductor wafer heat treatment method according to a fifth aspect of the present invention is a semiconductor wafer heat treatment method of heating a semiconductor wafer, wherein the method places a semiconductor wafer on a heating plate, and measures temperatures when heating the semiconductor wafer after dividing into a plurality of regions, and heats the semiconductor wafer while controlling, for each of the plurality of regions, the temperature when heating the semiconductor wafer, in accordance with the measured result of the temperatures.

Also, in order to accomplish the above-mentioned need, a semiconductor wafer heat treatment method according to a sixth aspect of the present invention is a semiconductor wafer heat treatment method of heating a semiconductor wafer and then cooling it, and includes the steps of: placing a semiconductor wafer equivalent heated to a predetermined temperature on a cooling plate, and measuring temperatures when cooling the semiconductor wafer equivalent, at portions preliminarily divided into a plurality of regions; placing a semiconductor wafer on a heating plate, and heating the semiconductor wafer to the predetermined temperature; and placing the semiconductor wafer heated to the predetermined temperature on the cooling plate, and cooling the semiconductor wafer while controlling, for each of the plurality of regions, the temperature when cooling the semiconductor wafer, in accordance with a measured result of the temperatures.

Also, in order to accomplish the above-mentioned need, a semiconductor wafer heat treatment method according to a seventh aspect of the present invention is a semiconductor wafer heat treatment method of heating a semiconductor wafer and then cooling it, and includes the steps of: placing a semiconductor wafer on a heating plate, and heating the semiconductor wafer to a predetermined temperature; and placing the semiconductor wafer heated to the predetermined temperature on a cooling plate, and measuring temperatures when cooling the semiconductor wafer, at portions preliminarily divided into a plurality of regions, and then cooling the semiconductor wafer while controlling, for each of the plurality of regions, the temperature when cooling the semiconductor wafer, in accordance with the measured result of the temperatures.

And, in order to accomplish the above-mentioned need, a semiconductor wafer heat treatment method according to an eighth aspect of the present invention is a semiconductor wafer heat treatment method of heating a semiconductor wafer and then cooling it, and includes the steps of: placing a semiconductor wafer on a heating plate, and heating the semiconductor wafer while performing a temperature control on each region; and placing the heated semiconductor wafer on a cooling plate, and cooling the semiconductor wafer while performing a temperature control on each region.

The semiconductor wafer heat treatment apparatus according to the first aspect of the present invention as mentioned above operates so that when the heating plate heats the semiconductor wafer to the predetermined temperature, the temperature measuring unit measures the temperatures when the semiconductor wafer or a semiconductor wafer equivalent placed on the heating plate is heated, at portions preliminarily divided into the plurality of regions, and in accordance with this measured result of the temperatures, the controller controls, for each of the plurality of regions, the temperature when the semiconductor wafer is heated.

The semiconductor wafer heat treatment apparatus according to the second aspect of the present invention as mentioned above operates so that, after the heating plate heats the semiconductor wafer to the predetermined temperature, when the cooling plate cools it, the temperature measuring unit measures the temperatures when the semiconductor wafer or the semiconductor wafer equivalent placed on the cooling plate is cooled at portions preliminarily divided into the plurality of regions, and in accordance with this measured result of the temperatures, the controller controls, for each of the plurality of regions, the temperature when the semiconductor wafer is cooled.

The semiconductor wafer heat treatment apparatus according to the third aspect of the present invention as mentioned above operates so that, when the heating plate heats the semiconductor wafer to the predetermined temperature and when the cooling plate cools the semiconductor wafer, the temperature of the semiconductor wafer is controlled for each of the plurality of regions.

The semiconductor wafer heat treatment method according to the fourth aspect of the present invention as mentioned above operates so that, when the heat treatment of the semiconductor wafer is carried out to heat the semiconductor wafer, the semiconductor wafer equivalent is placed on the heating plate, and the temperatures when the semiconductor wafer equivalent is heated are measured at portions preliminarily divided into the plurality of regions. Next, the semiconductor wafer is placed on the heating plate, and the semiconductor wafer is heated while the temperature when the semiconductor wafer is heated is controlled for each of the plurality of regions, in accordance with the measured result of the temperatures.

The semiconductor wafer heat treatment method according to the fifth aspect of the present invention as mentioned above operates so that, when the heat treatment of the semiconductor wafer is carried out to heat the semiconductor wafer, the semiconductor wafer is placed on the heating plate, and the temperatures when the semiconductor wafer is heated are measured at portions preliminarily divided into the plurality of regions. Then, the semiconductor wafer is heated while the temperature when the semiconductor wafer is heated is controlled for each of the plurality of regions, in accordance with the measured result of the temperatures.

The semiconductor wafer heat treatment method according to the sixth aspect of the present invention as mentioned above operates so that, after the heating plate heats the semiconductor wafer to the predetermined temperature, when the cooling plate cools it, the semiconductor wafer equivalent heated to the predetermined temperature is placed on the cooling plate, and the temperatures when the semiconductor wafer equivalent is cooled are measured at portions preliminarily divided into the plurality of regions. Next, the semiconductor wafer is placed on the heating plate, and the semiconductor wafer is heated to the predetermined temperature. Next, the semiconductor wafer heated to the predetermined temperature is placed on the cooling plate. Then, the semiconductor wafer is cooled while the temperature when the semiconductor wafer is cooled is controlled for each of the plurality of regions, in accordance with the measured result of the temperatures.

The semiconductor wafer heat treatment method according to the seventh aspect of the present invention as mentioned above operates so that, after the heating plate heats the semiconductor wafer to the predetermined temperature, when the cooling plate cools it, the semiconductor wafer is placed on the heating plate, and the semiconductor wafer is heated to the predetermined temperature. Next, the semiconductor wafer heated to the predetermined temperature is placed on the cooling plate, and the temperatures when the semiconductor wafer is cooled are measured at portions preliminarily divided into the plurality of regions. Then, the semiconductor wafer is cooled while the temperature when the semiconductor wafer is cooled is controlled for each of the plurality of regions, in accordance with the measured result of the temperatures.

In the semiconductor wafer heat treatment method according to the eighth aspect of the present invention as mentioned above, the semiconductor wafer heated while the temperature control is performed on each of the plurality of regions is cooled while the temperature control is performed on each of the plurality of regions. For this reason, in the series of the processes from the heating step to the cooling step, the heat treatment of the semiconductor wafer is carried out while the temperature control is performed on each of the plurality of regions.

DESCRIPTION OF THE PREFERRED EMBODIMENTS

Embodiments of the present invention will be described below by referring to the attached drawings.

First Embodiment

A heat treatment apparatus and a heat treatment method of a semiconductor wafer according to this embodiment are now explained.

Figure 1:
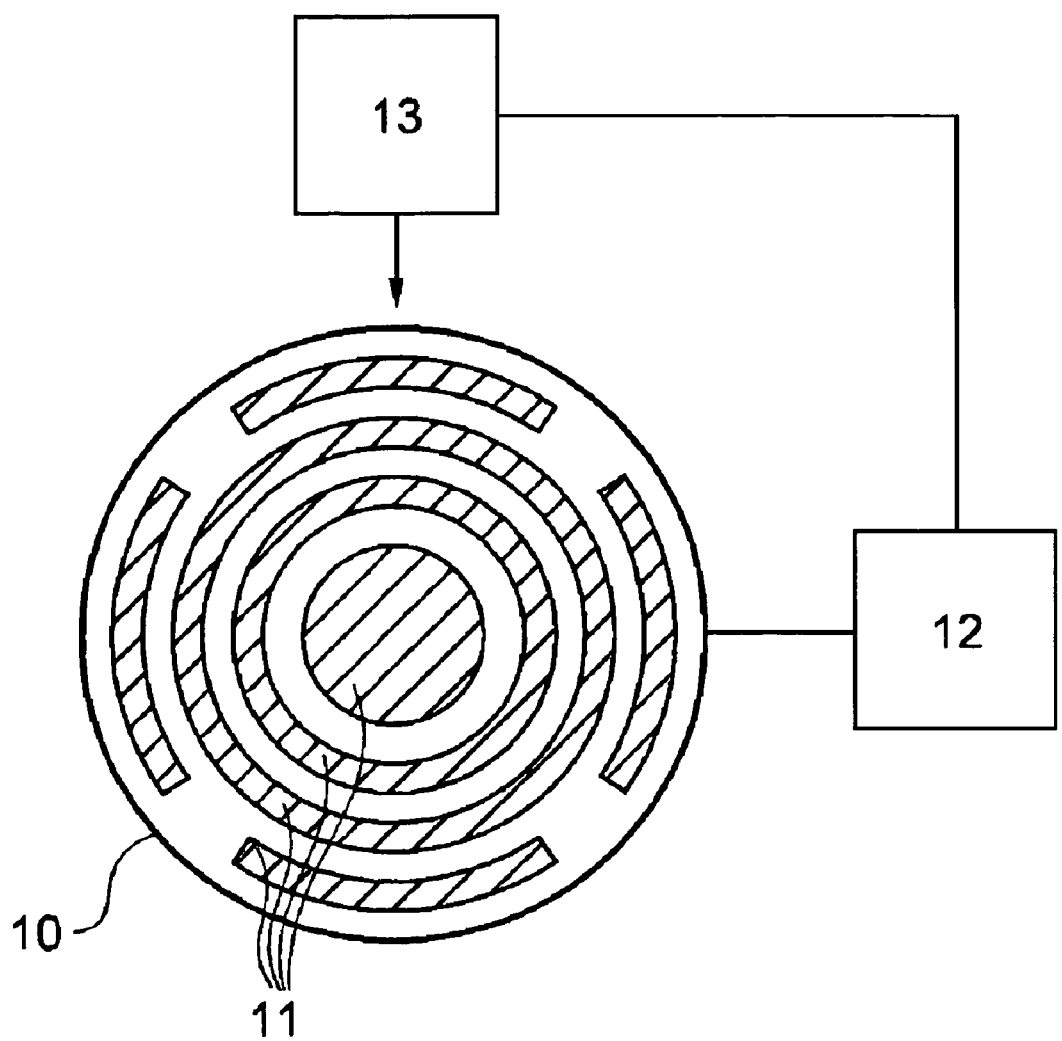
FIG. 1 is a schematically configurative view showing a heat treatment apparatus according to a first embodiment.

FIG. 1 is a schematically configurative view showing the heat treatment apparatus according to this embodiment.

This includes: a heating plate 10 for heating a semiconductor wafer to a predetermined temperature; a temperature measuring unit 13 for measuring temperatures when the semiconductor wafer or a semiconductor wafer equivalent placed on the heating plate 10 is heated, at portions preliminarily divided into a plurality of regions; and a controller 12 for controlling the temperatures of the semiconductor wafer.

The heating plate 10 contains therein heaters 11 that are divided correspondingly to the plurality of (for example, seven) regions.

The temperature measuring unit 13 may be, for example, a thermocouple embedded in a dummy semiconductor wafer. The temperature when the dummy semiconductor wafer serving as this semiconductor wafer equivalent is placed on and heated by the heating plate 10 can be measured at portions preliminarily divided into a plurality of regions that correspond to the division regions of the heaters of the heating plate 10.

Or, the temperature measuring unit 13 may be configured so as to measure, at a real time, the temperature when the semiconductor wafer is placed on and heated by the heating plate 10. In this case, the temperature measuring unit 13 may be possible to measure the temperatures of the respective regions of the semiconductor wafer placed on the heating plate 10. For example, it may be the thermocouple embedded in each of the divided regions of the heater of the heating plate 10. Thus, the temperatures when the semiconductor wafer is placed on and heated by the heating plate 10 can be measured at the portions preliminarily divided into the plurality of regions that correspond to the heater division regions of the heating plate 10.

The controller 12 sets the temperature of the heating operation of the heating plate 10, and controls, for each of the plurality of regions, the temperature when the semiconductor wafer is heated, in accordance with the measurement result that the temperature when the semiconductor wafer or the semiconductor wafer equivalent placed on the heating plate 10 is heated is measured by the temperature measuring unit 13 at the portions divided into the plurality of regions.

For example, before the heating plate 10 heats semiconductor wafer, the heating plate 10 heats the dummy semiconductor wafer in which the thermocouple serving as the semiconductor wafer equivalent is embedded. Then, the temperature at this time is measured by the thermocouple.

When the heating plate heats the semiconductor wafer, the controller adjusts the temperatures of the heaters in the heating plate 10, in accordance with the result of the temperatures measured by the temperature measuring unit. Then, the heating process is carried out while the temperature of the semiconductor wafer is controlled for each of the plurality of regions.

As the temperature controlling method by the controller 12 as mentioned above, for example, an allowance is established for the result of the temperatures measured by the temperature measuring unit 13. Then, in such a way that the temperatures are within the allowance, the controller controls the temperature of the semiconductor wafer, for each of the plurality of regions.

As the allowance for each of the temperature measurement times as mentioned above, for example, it is established for each heated temperature or each measurement time. In a case of going beyond this allowance, the temperatures of the heaters contained in the respective division regions of the heating plate 10 are adjusted.

For example, if the PEB process is carried out at 130° C. for 90 seconds, in order to establish the allowance of the temperature for each measurement time, the allowance shown in the following table 1 are established for a temperature rising period between 5 and 20 seconds after the start of the PEB process, a stable period of the temperature between 25 and 90 seconds, and the temperature lowering period on and after 95 seconds.

TABLE 1

| Temperature Rising Period | | | |
|---|---|---|---|
| 5 sec after | 10 sec after | 15 sec after | 20 sec after |
| ±3.0° C. | ±4.0° C. | ±1.5° C. | ±0.8° C. |

| Stable Period | | | | |
|---|---|---|---|---|
| 25 sec after | 30 sec after | 35 sec after | — | 90 sec after |
| ±0.5° C. | ±0.3° C. | ±0.2° C. | — | ±0.2° C. |

| Temperature Lowering Period | | | | | | | |
|---|---|---|---|---|---|---|---|
| 95 sec after | 100 sec after | 105 sec after | 110 sec after | 115 sec after | 120 sec after | 125 sec after | 130 sec after |
| ±3.0° C. | ±10.0° C. | ±5.0° C. | ±2.0° C. | ±2.0° C. | ±2.0° C. | ±2.0° C. | ±2.0° C. |

The heat treatment apparatus in this embodiment also has a cooling plate (not shown), for example, which contains therein a water cooled tube. The semiconductor wafer after the above-mentioned heat treatment of the heating plate is rapidly moved onto the water cooled tube and cooled thereon.

The heat treatment method of using the above-mentioned heat treatment apparatus and then performing the PEB process on the semiconductor wafer is explained.

At first, the dummy semiconductor wafer (the semiconductor wafer equivalent) in which the thermocouples are embedded at portions preliminarily divided into the plurality of regions is placed on the heating plate heated to a predetermined temperature (for example, 130° C.). Then, the temperature rising manner for each region at this time is measured by the thermocouple. From the measurement result of the temperatures as mentioned above, the temperature adjustment condition of the heaters, for example, which are embedded in the heating plate is determined as the heating condition to suppress the variation in the temperatures when the heat treatment is actually performed on the semiconductor wafer.

Next, the semiconductor wafer, for example, on which the resist film of the chemically amplified type is formed and an exposing process is performed is placed on the heating plate 10. Then, in accordance with the heating condition (the temperature adjustment condition) determined from the measurement result of the temperatures as mentioned above, while the temperature when the semiconductor wafer is heated is controlled for each of the plurality of regions, the heating process of a predetermined time is performed on the semiconductor wafer.

Next, after the elapse of the period of the heat treatment, by moving the semiconductor wafer onto the cooling plate (not shown) containing therein the water cooled tube, the semiconductor wafer is cooled.

The developing process is performed on the semiconductor wafer on which the above-mentioned PEB process is performed. Then, the subsequent steps are further performed thereon.

Also, the heat treatment method of using the above-mentioned heat treatment apparatus and performing the PEB process on the semiconductor wafer can be carried out as follows.

At first, the semiconductor wafer, for example, on which the resist film of the chemically amplified type is formed and the exposing process is performed is placed on the heating plate heated to the predetermined temperature (for example, 130° C.). At this time, the temperature rising manner for each of the plurality of regions into which the semiconductor wafer is divided is measured by the temperature measuring unit. From this measurement result of the temperatures, the heating condition is determined so as to suppress the temperature variation. In accordance with this heating condition, while the temperature is controlled for each of the plurality of regions, the heating process of the predetermined time is performed on the semiconductor wafer. At this time, the temperatures of the respective regions of the semiconductor wafer placed on the heating plate are measured by the temperature measuring unit, without using the thermocouple embedded in the dummy semiconductor wafer serving as the semiconductor wafer equivalent.

Next, after the elapse of the period of the heat treatment, by moving the semiconductor wafer onto the cooling plate (not shown) containing therein the water cooled tube, the semiconductor wafer is cooled.

The developing process is performed on the semiconductor wafer on which the PEB process is performed as mentioned above. After that, the subsequent steps are further performed thereon.

According to the semiconductor wafer heat treatment apparatus according to this embodiment as mentioned above and the heat treatment method using this apparatus, the heat treatment (PEB process) can be carried out so as to suppress the variations in the line widths within the surface on the semiconductor wafer and the like.

Second Embodiment

Figure 2A:
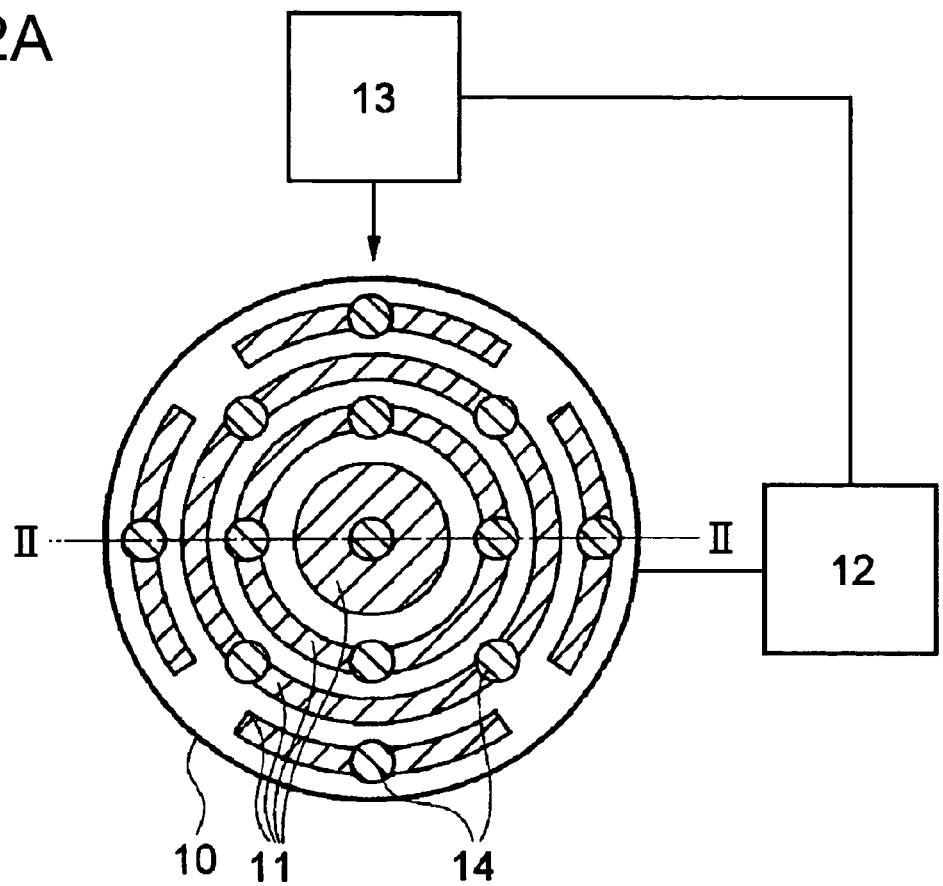
FIG. 2A is a schematically configurative view showing a heat treatment apparatus according to a second embodiment.
Figure 2B:
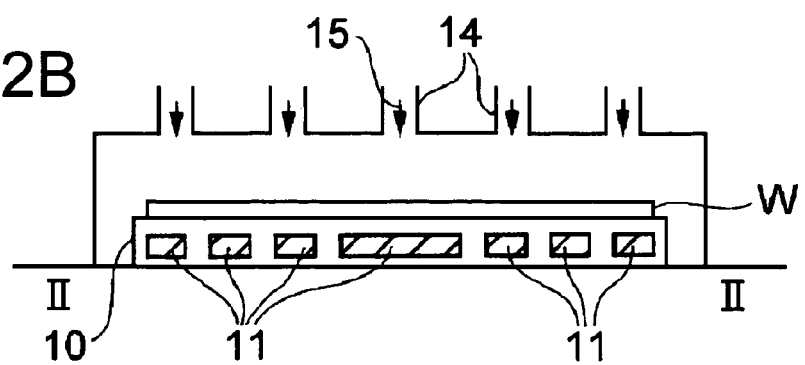
FIG. 2B is a cross-sectional view showing a heating plate portion.

FIG. 2A is a schematically configurative view showing a heat treatment apparatus according to a second embodiment, and FIG. 2B is a cross-sectional view showing a heating plate portion.

A heating plate 10 contains therein heaters 11 divided correspondingly to, for example, the plurality of (for example, seven) regions similarly to the first embodiment. Moreover, a gas blowing port 14 for blowing off a cold gas 15 is formed for each of the plurality of regions, oppositely to the heating plate 10.

A controller 12 sets the temperature of the heating operation of the heating plate 10. In accordance with the measurement result that the temperature when the semiconductor wafer or semiconductor wafer equivalent placed on the heating plate 10 is heated is measured by the temperature measuring unit 13 after the division into a plurality of regions, similarly to the first embodiment, the controller adjusts the temperatures of the heaters in the heating plate 10. Moreover, it controls the flow amount of the cold gases 15 that are blown off to a semiconductor wafer W from the individual gas blowing ports 14, and carries out the heating process while controlling the temperature of the semiconductor wafer for each of the plurality of regions. By synchronizing the heating pattern with the flows of the cold gases blown off from the respective gas blowing ports, the cold gas whose cooling efficiency is made higher is blown off into the region having the high temperature variation. Consequently, the temperature variation is corrected.

The other configurations are similar to those of the first embodiment.

The heat treatment method of using the above-mentioned heat treatment apparatus and performing the PEB process on the semiconductor wafer is explained.

At first, the dummy semiconductor wafer in which the thermocouples are embedded after the division into the plurality of regions is placed on the heating plate heated to the predetermined temperature (for example, 130° C.). Then, the temperature rising manner for each region at this time is measured by a thermocouple. From the measurement result of the temperatures as mentioned above, the temperature adjustment condition of the heaters, for example, which are embedded in the heating plate, and the flow amount condition of the cold gases blown off from the gas blowing ports 14 are determined as the heating condition to suppress the variation in the temperatures when the heat treatment is actually performed on the semiconductor wafer.

Next the semiconductor wafer, for example, on which the resist film of the chemically amplified type is formed and the exposing process is performed is placed on the heating plate. Then, in accordance with the heating condition determined from the measurement result of the temperatures as mentioned above, while the temperature when the semiconductor wafer is heated is controlled for each of the plurality of regions, the heating process of a predetermined time is performed on the semiconductor wafer.

Next, after the elapse of the period of the heat treatment, by moving the semiconductor wafer onto the cooling plate (not shown) containing therein the water cooled tube, the semiconductor wafer is cooled.

The developing process is performed on the semiconductor wafer on which the above-mentioned PEB process is performed. Then, the subsequent steps are further performed thereon.

Also, the heat treatment method of using the above-mentioned heat treatment apparatus and performing the PEB process on the semiconductor wafer can be carried out as follows.

At first, the semiconductor wafer, for example, on which the resist film of the chemically amplified type is formed and the exposing process is performed is placed on the heating plate heated to the predetermined temperature (for example, 130° C.). At this time, the temperature rising manner for each of the plurality of regions into which the semiconductor wafer is divided is measured by the temperature measuring unit. From this-measurement result of the temperatures, the heating conditions, such as the temperature adjustment condition of the heaters and the flow amount condition of the cold gases and the like, are determined so as to suppress the temperature variation. In accordance with those heating conditions, while the temperature is controlled for each of the plurality of regions, the heating process of the predetermined time is performed on the semiconductor wafer. At this time, the temperatures of the respective regions of the semiconductor wafer placed on the heating plate are measured by the temperature measuring unit, without using the thermocouple embedded in the dummy semiconductor wafer serving as the semiconductor wafer equivalent.

Next, after the elapse of the period of the heat treatment, by moving the semiconductor wafer onto the cooling plate (not shown) containing therein the water cooled tube, the semiconductor wafer is cooled.

The developing process is performed on the semiconductor wafer on which the PEB process is performed as mentioned above. After that, the subsequent steps are further performed thereon.

According to the semiconductor wafer heat treatment apparatus according to this embodiment as mentioned above and the heat treatment method using this apparatus, the heat treatment (PEB process) can be carried out so as to suppress the variations in the line widths within the surface on the semiconductor wafer and the like.

Third embodiment

A heat treatment apparatus and a heat treatment method of a semiconductor wafer according to a third embodiment are explained.

Figure 3:
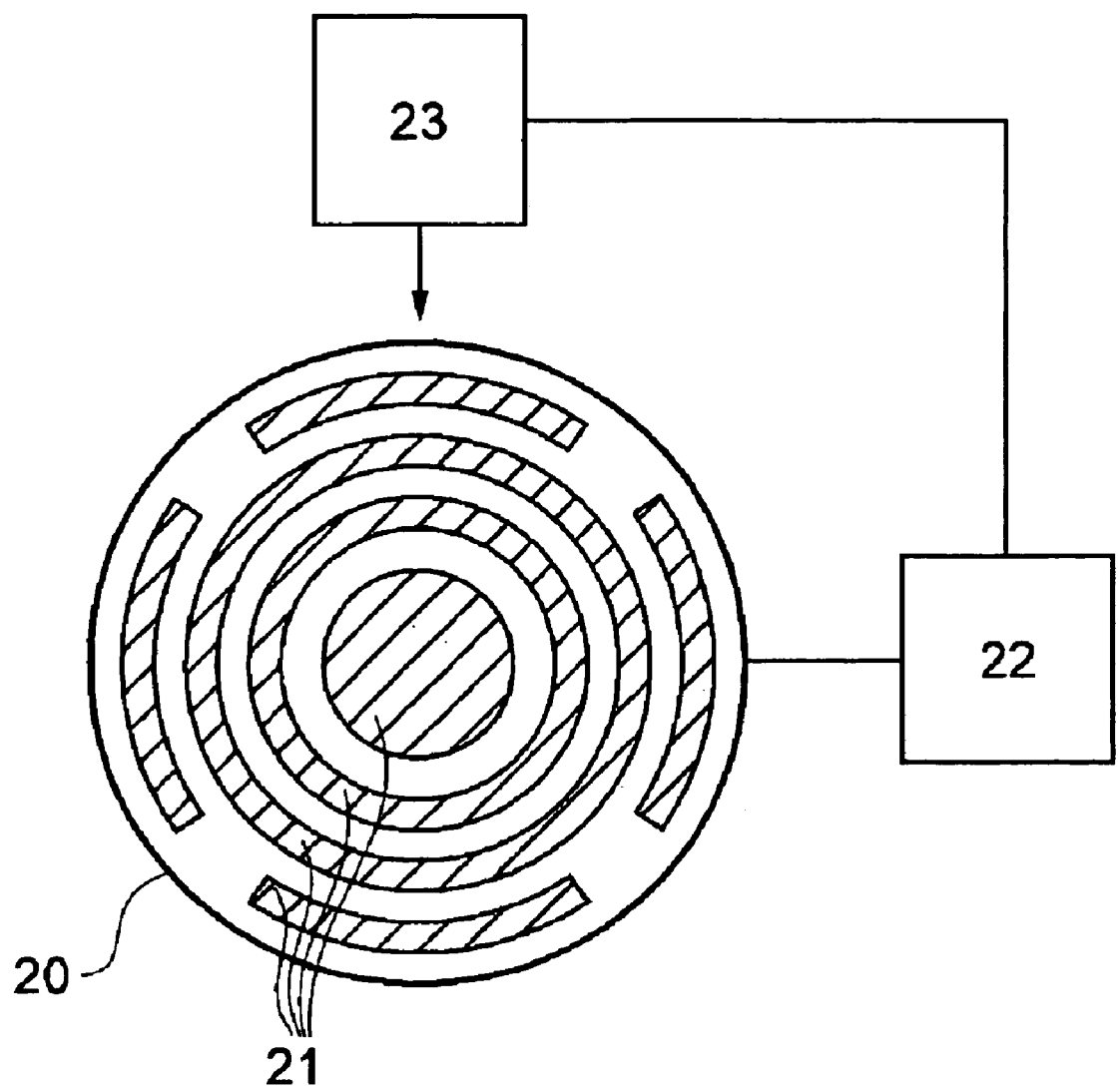
FIG. 3 is a schematically configurative view showing a heat treatment apparatus according to a third embodiment.

FIG. 3 is a schematically configurative view showing a main portion of a heat treatment apparatus according to this embodiment.

This includes: a heating plate (not shown) for heating a semiconductor wafer to a predetermined temperature; a cooling plate 20 for cooling the semiconductor wafer heated to the predetermined temperature; a temperature measuring unit 23 for measuring temperatures, when the semiconductor wafer or semiconductor wafer equivalent placed on the cooling plate 20 is cooled, at portions preliminarily divided into a plurality of regions; and a controller 22 for controlling the temperatures of the semiconductor wafer.

For example, similarly to the first and second embodiments, it can be designed such that the heating plate contains therein heaters 11 divided into, for example, the plurality of (for example, seven) regions, and a gas blowing port for the cold gas is further formed for each of the regions, oppositely to the heating plate. Also, a temperature measuring unit is installed in the portion of the heating plate. In accordance with the measurement result that the temperatures when the semiconductor wafer or semiconductor wafer equivalent placed on the heating plate is heated are measured by the temperature measuring unit at portions divided into the plurality of regions, the temperatures of the semiconductor wafer can be controlled to carry out the heating process.

The cooling plate 20 contains therein cooled tubes (water cooled tubes) 21 divided correspondingly to, for example, the plurality of (for example, seven) regions.

The temperature measuring unit 23 is, for example, the thermocouple embedded in the dummy semiconductor wafer. The temperature when the dummy wafer serving as this semiconductor wafer equivalent is heated to a predetermined temperature and then placed on and cooled by the cooling plate 20 can be measured after dividing into the plurality of regions corresponding to the division regions of the cooled tubes of the cooling plate 20.

Or, the temperature measuring unit 23 may be configured so as to measure, at a real time, the temperature when the semiconductor wafer heated to the predetermined temperature is placed on and cooled by the cooling plate 20. In this case, the temperature measuring unit 23 may be possible to measure the temperatures of the respective regions of the semiconductor wafer placed on the cooling plate 20. For example, it may be a thermocouple embedded in each of the heater division regions of the cooling plate 20. Thus, the temperature when the semiconductor wafer is placed on the cooling plate 20 and the heating process is performed thereon can be measured by dividing into the plurality of regions corresponding to the divided regions of the heater of the cooling plate 20.

The controller 22 sets the temperature of the cooling operation of the cooling plate 20, and controls the temperature when the semiconductor wafer is cooled, for each of the plurality of regions, in accordance with the measurement result that the temperature when the semiconductor wafer or semiconductor wafer equivalent placed on the cooling plate 20 is cooled is measured by the temperature measuring unit 23 at portions divided into the plurality of regions.

For example, before the semiconductor wafer is cooled by the cooling plate 20, the dummy semiconductor wafer, in which the thermocouple serving as the semiconductor wafer equivalent is embedded, is heated to the predetermined temperature. Then, it is cooled by the cooling plate 20. The temperature at this time is measured by the thermocouple.

When the semiconductor wafer is cooled by the cooling plate, in accordance with the result of the temperatures measured by the temperature measuring unit, the controller adjusts the temperatures of the cooled tubes in the cooling plate 20 and the like. Then, it is cooled while the temperature of the semiconductor wafer is controlled for each of the plurality of regions.

As the temperature controlling method by the controller 22 as mentioned above, for example, an allowance is established for the result of the temperatures measured by the temperature measuring unit 23. Then, in such a way that the temperatures are within the allowance, the controller controls the temperature of the semiconductor wafer for each of the plurality of regions.

As the allowance for each of the measurement times of the temperatures as mentioned above, for example, it may be established for each predetermined heated temperature or each treatment time. In a case of going beyond the allowance, the temperature of the cooled tube 21 contained in each of the divided regions of the cooling plate 20 and the like are adjusted.

The heat treatment method of using the above-mentioned heat treatment apparatus and then performing the PEB process on the semiconductor wafer is explained.

At first, the dummy semiconductor wafer in which the thermocouples are embedded at portions preliminarily divided into the plurality of regions is heated to the predetermined temperature (for example, 130° C.). This is placed on the cooling plate set at a predetermined temperature (for example, about 20° C.). Then, the temperature lowering manner for each of the regions at this time is measured by the thermocouple. From the measurement result of the temperatures as mentioned above, the temperature adjustment condition of the cooled tubes, for example, which are embedded in the cooling plate is determined as the cooling condition to suppress the variation in the temperatures when the semiconductor wafer is actually cooled.

Next, the semiconductor wafer, for example, on which the resist film of the chemically amplified type is formed and the exposing process is performed is placed on the heating plate, and the heating process of the predetermined time is performed thereon.

Next, the semiconductor wafer is cooled by moving the semiconductor wafer, on which the heating process is performed, onto the cooling plate and meanwhile controlling the temperature for each of the plurality of regions, in accordance with the cooling condition determined from the measurement result of the temperature as mentioned above.

The developing process is performed on the semiconductor wafer on which the above-mentioned PEB process is performed. Then, the subsequent steps are further performed thereon.

Also, the heat treatment method of using the above-mentioned heat treatment apparatus and then performing the PEB process on the semiconductor wafer can be carried out as follows.

At first, the semiconductor wafer, for example, on which the resist film of the chemically amplified type is formed and the exposing process is performed is placed on the heating plate heated to the predetermined temperature (for example, 130° C.), and the heating process of the predetermined time is performed thereon.

Next, the semiconductor wafer on which the heating process is performed is moved onto the cooling plate set at the predetermined temperature (for example, about 20° C.). At this time, the temperature lowering manner for each of the plurality of regions into which the semiconductor wafer is divided is measured by the temperature measuring unit. From this measurement result of the temperatures, the cooling condition is determined so as to suppress the temperature variation. In accordance with this cooling condition, while the temperature is controlled for each of the plurality of regions, the semiconductor wafer is cooled. At this time, the temperatures of the respective regions of the semiconductor wafer placed on the cooling plate are measured by the temperature measuring unit, without using the thermocouple embedded in the dummy semiconductor wafer serving as the semiconductor wafer equivalent.

The developing process is performed on the semiconductor wafer on which the PEB process is performed as mentioned above. After that, the subsequent steps are further-performed thereon.

According to the semiconductor wafer heat treatment apparatus according to this embodiment as mentioned above and the heat treatment method using this apparatus, the heat treatment (PEB process) can be carried out so as to suppress the variations in the line widths within the surface on the semiconductor wafer and the like.

Fourth Embodiment

Figure 4A:
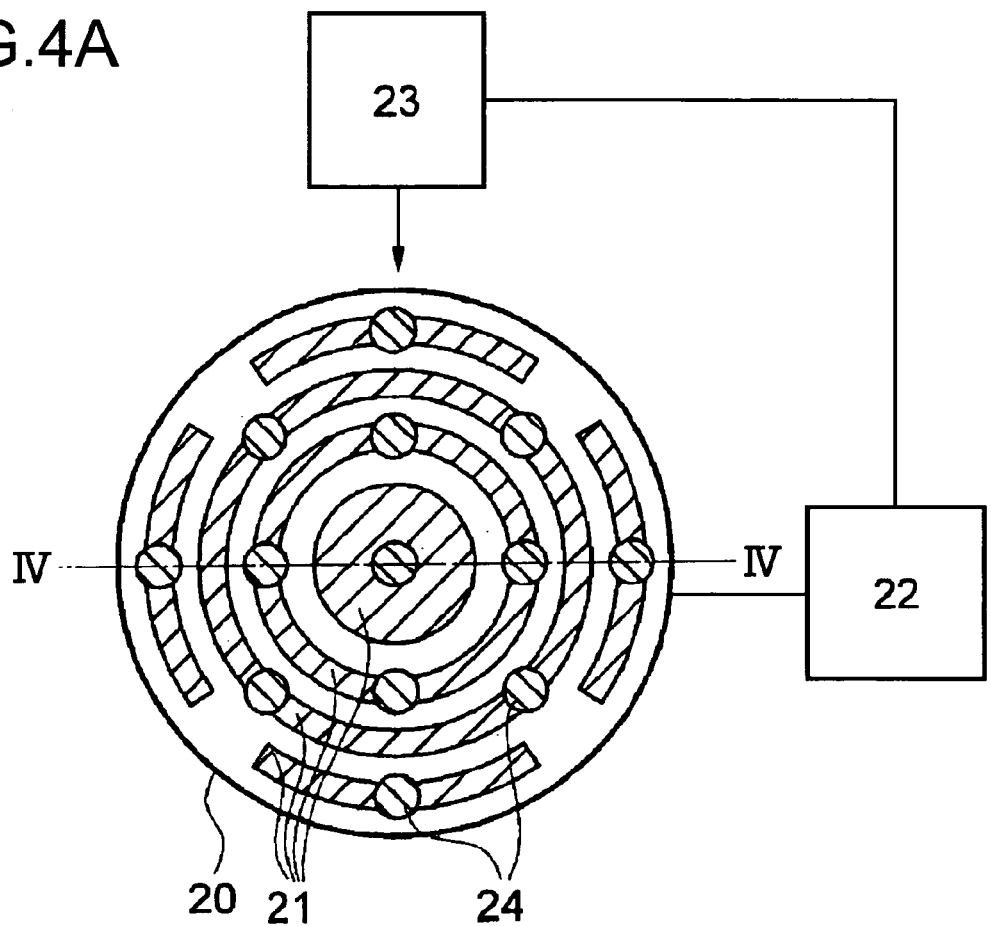
FIG. 4A is a schematically configurative view showing a heat treatment apparatus according to a fourth embodiment.
Figure 4B:
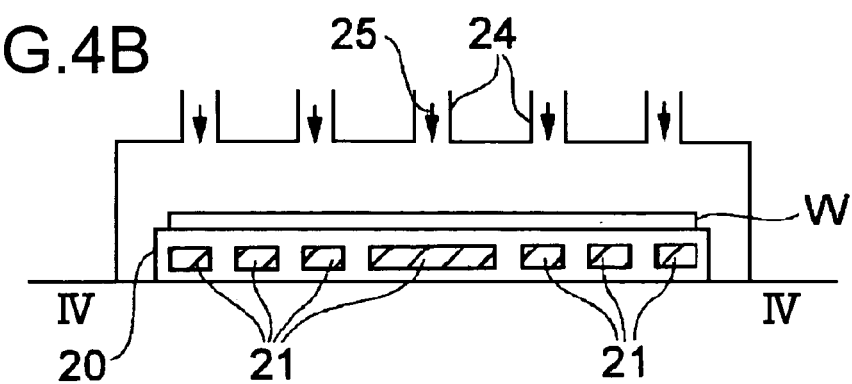
FIG. 4B is a sectional view showing a cooling plate portion.
Figure 5:
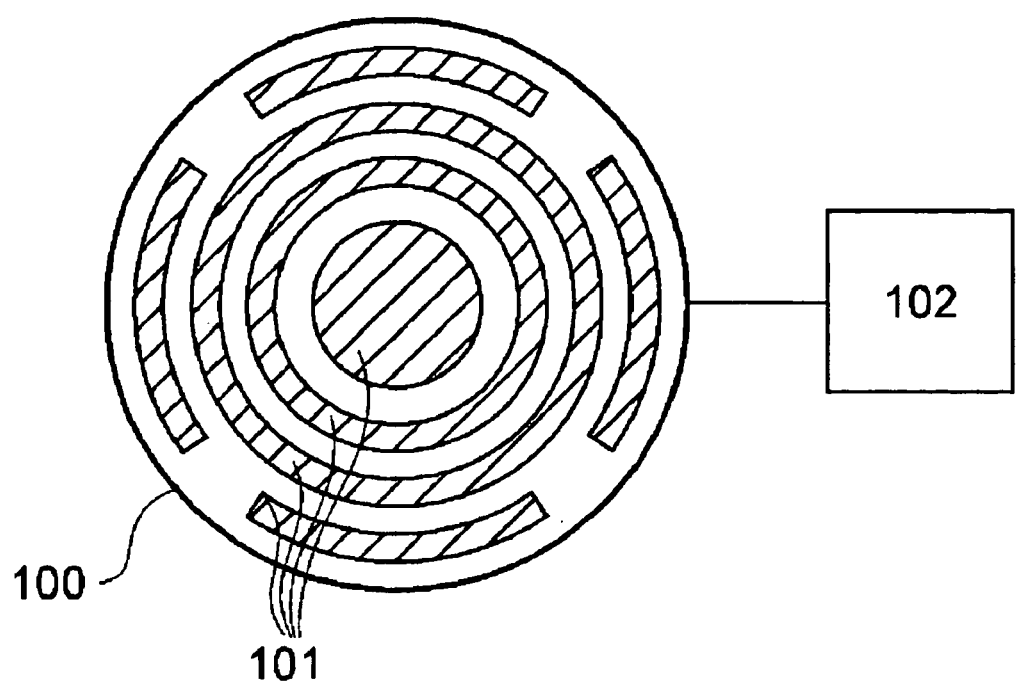
FIG. 5 is a schematically configurative view showing a heat treatment apparatus according to a conventional example.
Figure 6:
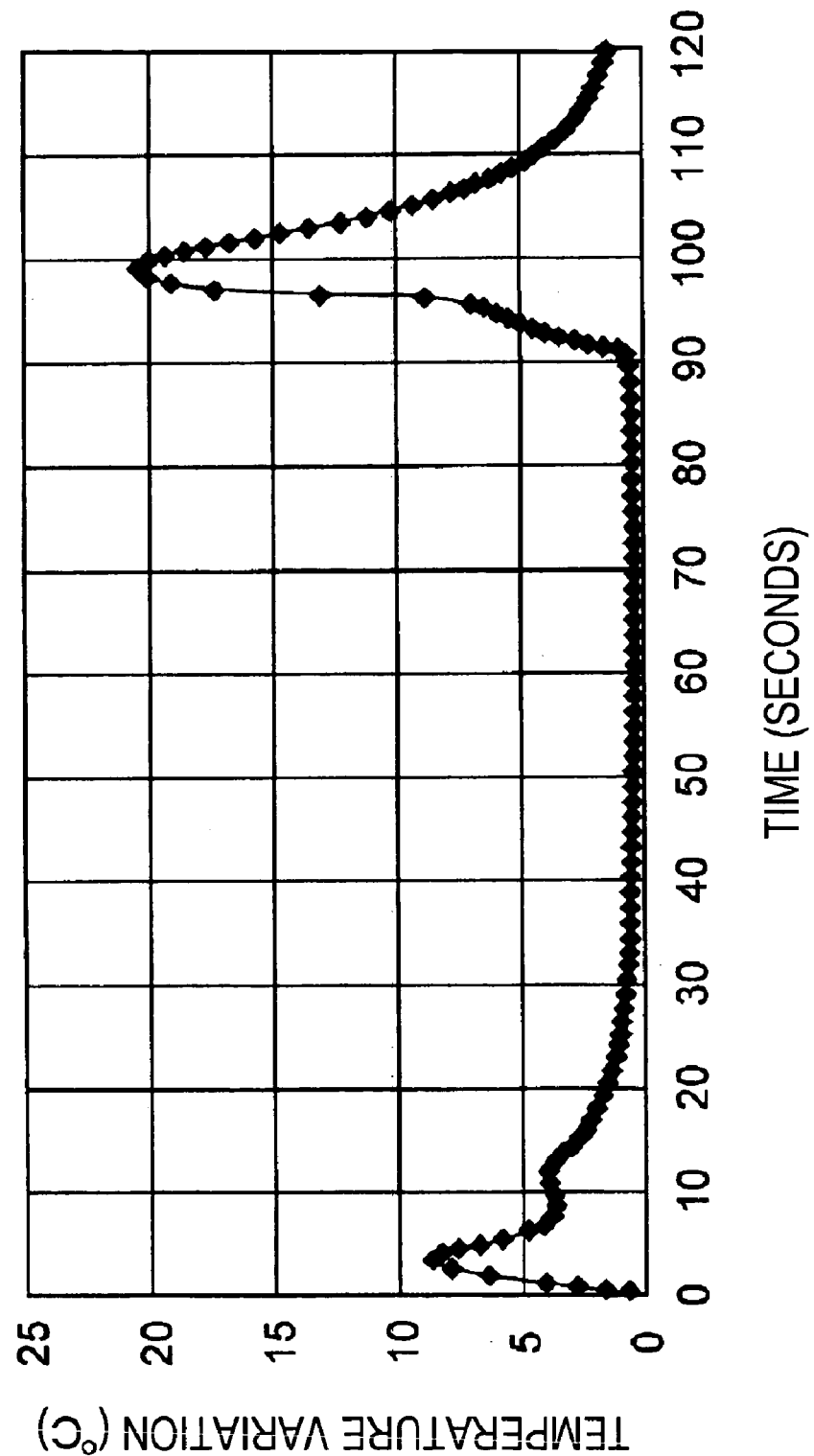
FIG. 6 is a profile of temperature variations in a PEB process of the conventional example.
Figure 7A:
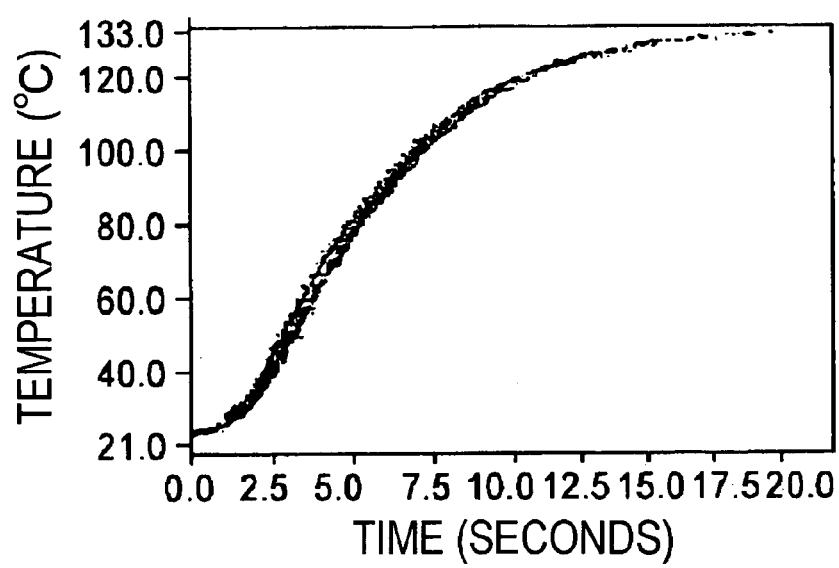
FIGS. 7A to 7C are views in which temperatures in the PEB process measured at respective positions of a semiconductor wafer in the conventional example are plotted.
Figure 7B:
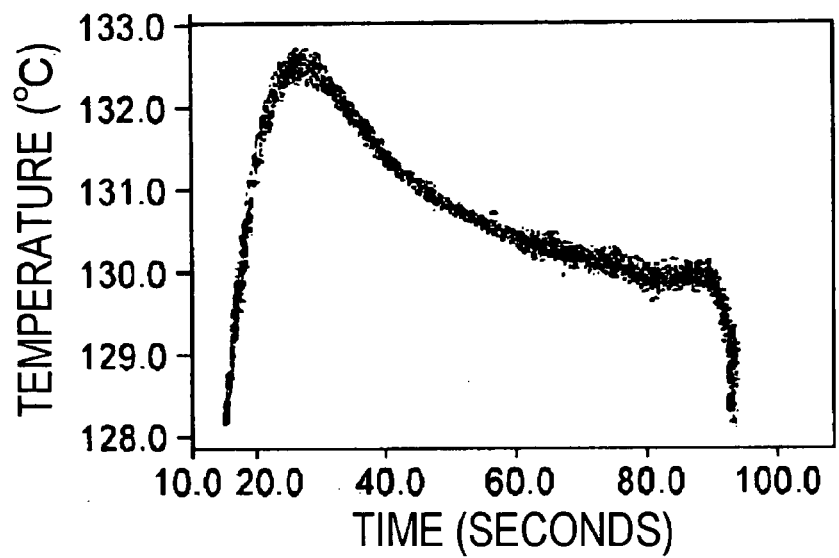
Figure 7C:
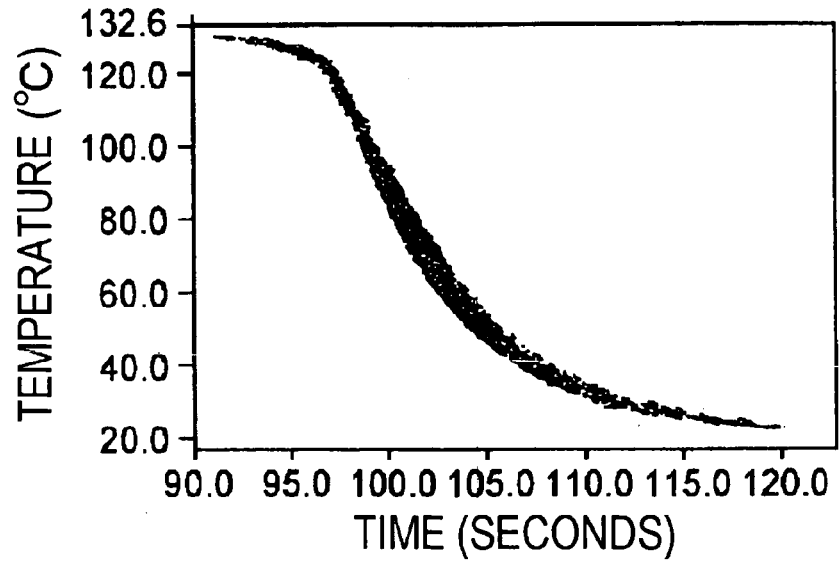
Figure 8A:
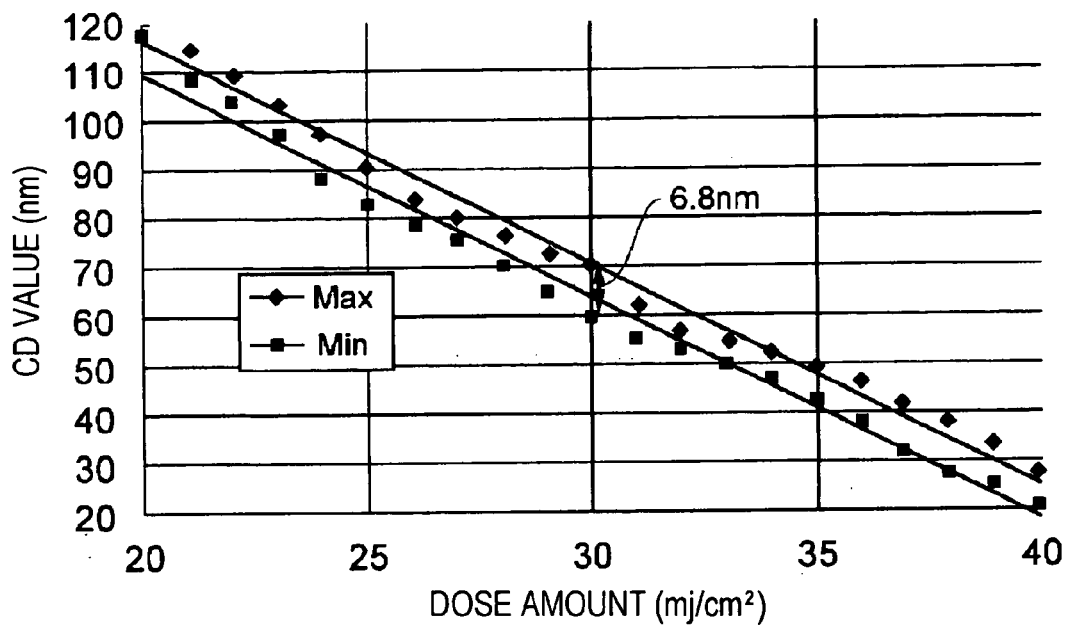
FIG. 8A is a graph showing a line width when the PEB processing temperature is the highest temperature and a line width when it is the lowest temperature, in an isolation pattern having a line width of 70 nm.
Figure 8B:
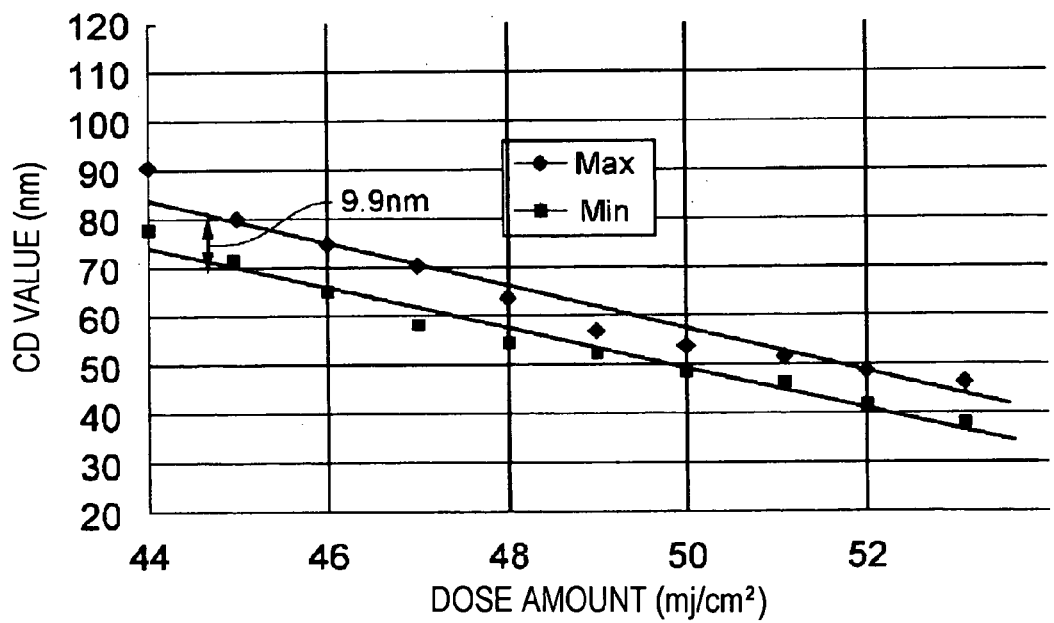
FIG. 8B is a graph showing the similar line widths in a pattern of a line space of a line width of 90 nm, and the line widths are all calculated from a simulation.

FIG. 4A is a schematically configurative view showing a heat treatment apparatus according to a fourth embodiment, and FIG. 4B is a cross-sectional view of a cooling plate portion.

A heating plate can be configured similarly to those of the first and second embodiments.

A cooling plate 20 contains therein cooled tubes (water cooled tubes) 21 divided correspondingly to, for example, the plurality of (for example, seven) regions similarly to the third embodiment. Moreover, a gas blowing port 24 for blowing off a cold gas 25 is formed for each of the plurality of regions, oppositely to the cooling plate 20.

A controller 22 establishes the temperature of the cooling operation of the cooling plate 20. In accordance with the measurement result that the temperatures when the semiconductor wafer or semiconductor wafer equivalent placed on the cooling plate 20 is cooled are measured by a temperature measuring unit 23 after the division into the plurality of regions, similarly to the third embodiment, the controller adjusts the temperatures of the cooled tubes 21 in the cooling plate 20. Moreover, it controls the flow amount of the cold gases 25 that are blown off to the semiconductor wafer W from the individual gas blowing ports 24, and carries out the cooling operation while controlling the temperature of the semiconductor wafer for each of the plurality of regions.

The other configurations are similar to those of the third embodiment.

The heat treatment method of using the above-mentioned heat treatment apparatus and performing the PEB process on the semiconductor wafer is explained.

At first, the dummy semiconductor wafer in which the thermocouples are embedded at portions divided into the plurality of regions is heated to the predetermined temperature (for example, 130° C.). This is placed on the cooling plate set at the predetermined temperature (for example, about 20° C.). Then, the temperature lowering manner for each of the regions at this time is measured by the thermocouple. From the measurement result of the temperature as mentioned above, for example, the temperature adjustment condition of the cooled tubes which are embedded in the cooling plate and the flow amount condition of the cold gases blown off from the gas blowing ports are determined as the cooling condition to suppress the variation in the temperatures when the semiconductor wafer is actually cooled.

Next, the semiconductor wafer, for example, on which the resist film of the chemically amplified type is formed and the exposing process is performed is placed on the heating plate, and the heating process of the predetermined time is performed thereon.

Next, the semiconductor wafer is cooled by moving the semiconductor wafer, on which the heating process is performed, onto the cooling plate and meanwhile controlling the temperature for each of the plurality of regions, in accordance with the cooling condition determined from the measurement result of the temperature as mentioned above.

The developing process is performed on the semiconductor wafer on which the above-mentioned PEB process is performed. Then, the subsequent steps are further performed thereon.

Also, the heat treatment method of using the above-mentioned heat treatment apparatus and then performing the PEB process on the semiconductor wafer can be carried out as follows.

At first, the semiconductor wafer, for example, on which the resist film of the chemically amplified type is formed and the exposing process is performed is placed on the heating plate heated to the predetermined temperature (for example, 130° C.), and the heating process of the predetermined time is performed thereon.

Next, the semiconductor wafer on which the heating process is performed is moved onto the cooling plate set at the predetermined temperature (for example, about 20° C.). At this time, the temperature lowering manner for each of the plurality of regions into which the semiconductor wafer is divided is measured by the temperature measuring unit. From this measurement result of the temperatures, the cooling conditions, such as the temperature adjustment condition of the cooled tubes and the flow amount condition of the cold gases and the like, are determined so as to suppress the temperature variation. In accordance with those cooling conditions, while the temperature is controlled for each of the plurality of regions, the semiconductor wafer is cooled. At this time, the temperatures of the respective regions of the semiconductor wafer placed on the cooling plate are measured by the temperature measuring unit, without using the thermocouple embedded in the dummy semiconductor wafer serving as the semiconductor wafer equivalent.

The developing process is performed on the semiconductor wafer on which the PEB process is performed as mentioned above. After that, the subsequent steps are further performed thereon.

According to the semiconductor wafer heat treatment apparatus according to this embodiment as mentioned above and the heat treatment method using this apparatus, the heat treatment (PEB process) can be carried out so as to suppress the variations in the line widths within the surface on the semiconductor wafer and the like.

Fifth Embodiment

In the above-mentioned first to fourth embodiments, the method of carrying out the control to suppress the variation in the temperatures in the process for heating the semiconductor wafer has been explained. However, for example, it is possible to suppress the variation in the line widths by rather giving a temperature distribution without suppressing the variation in the temperatures, or by making the heating period variable, in order to suppress the variation in the line widths on the resist film of the chemically amplified type.

Also in this case, the heat treatment apparatuses according to the above-mentioned first to fourth embodiments can be used to divide into each region, thereby controlling the temperature distribution and the heating period.

The present invention is not limited to the above-mentioned embodiments.

For example, in the second and fourth embodiments, the temperature adjustment of the heater or the cooled tube is carried out simultaneously with the operation for blowing off the cold gas. However, the variation in the temperatures may be suppressed only by the operation for blowing off the cold gas.

Also, the configurations and methods noted in the first to fifth embodiments can be suitably combined and executed.

In this case, as the heat treatment apparatus of the semiconductor wafer, the heat treatment apparatus in which the heat treatment apparatus noted in the first or second embodiment and the heat treatment apparatus noted in the third or fourth embodiment are combined is configured.

And, as the heat treatment method of using the heat treatment apparatus combined as mentioned above and performing the PEB process on the semiconductor wafer, as explained in any one of the first and second embodiments, the semiconductor wafer is firstly placed on the heating plate, and the heating process is performed on the semiconductor wafer while the temperature is controlled for each region. After that, as explained in any one of the third and fourth embodiments, the semiconductor wafer is placed on the cooling plate, and the semiconductor wafer is cooled while the temperature is controlled for each region. Then, the developing process is performed on the semiconductor wafer on which the above-mentioned PEB process is performed, and the subsequent steps are further performed thereon.

Also, when the heat treatment method of using the heat treatment apparatus combined as mentioned above and performing the PEB process on the semiconductor wafer is executed, it is assumed that the temperature controls in the heating and cooling operations are carried out so as to enable the integration value of the temperatures in the respective regions of the semiconductor wafer to belong to the predetermined allowable values.

According to the semiconductor wafer heat treatment apparatus having the above-mentioned configuration and the heat treatment method of using it, the temperatures in the respective regions of the semiconductor wafer are controlled in the heating operation and the subsequent cooling operation. Thus, the thermal energies applied to the respective regions of the semiconductor wafer are further averaged over the above-mentioned first to fourth embodiments. Hence, the heat treatment (PEB process) can be carried out so as to further surely suppress the variations in the line widths within the surface on the semiconductor wafer and the like.

In addition, various modifications can be made without departing from the sprit and scope of the present invention.

According to the semiconductor wafer heat treatment apparatus of the present invention, the heat treatment can be carried out so as to suppress the variations in the line widths within the surface on the semiconductor wafer and the like.

Also, according to the semiconductor wafer heat treatment method of the present invention, by using the semiconductor wafer heat treatment apparatus of the present invention, the heat treatment can be carried out so as to suppress the variations in the line widths within the surface on the semiconductor wafer and the like.

What is claimed is:

1. A semiconductor wafer heat treatment apparatus comprising:
    a heating plate for heating a semiconductor wafer to a predetermined temperature;
    a first temperature measuring unit for measuring temperatures of a semiconductor wafer or a semiconductor wafer equivalent placed on said heating plate at portions preliminarily divided into a plurality of regions;
    a first controller for controlling the temperature of said semiconductor wafer on said heating plate, for each of said plurality of regions, in accordance with a result of the temperatures measured by said first temperature measuring unit;
    a cooling plate for cooling said semiconductor wafer heated to said predetermined temperature;
    a second temperature measuring unit for measuring the temperatures of the semiconductor wafer or the semiconductor wafer equivalent placed on said cooling plate at portions preliminarily divided into a plurality of regions; and
    a second controller for controlling the temperature of said semiconductor wafer on said cooling plate, for each of said plurality of regions, in accordance with a result of the temperatures measured by said second temperature measuring unit;
    wherein the first controller controls the temperature of said semiconductor during a temperature-rising time period having a plurality of temperature-rising time period increments for each one of the plurality of regions, each one of the plurality of temperature-rising time period increments being associated with a range of temperature tolerances within which the temperature associated with a particular temperature-rising time period increment is maintained and
    wherein the second controller controls the temperature of said semiconductor during a temperature-lowering time period having a plurality of temperature-lowering time period increments for each one of the plurality of regions, each one of the plurality of temperature-lowering time period increments being associated with a range of temperature tolerances within which the temperature associated with a particular temperature-lowering time period increment is maintained.

2. A semiconductor wafer heat treatment method of heating a semiconductor wafer, comprising the steps of:
    placing a semiconductor wafer equivalent on a heating plate, and measuring temperatures when heating said semiconductor wafer equivalent, at portions preliminarily divided into a plurality of regions; and
    placing a semiconductor wafer on said heating plate, and heating said semiconductor wafer while controlling the temperature when heating said semiconductor wafer, for each of said plurality of regions, in accordance with a measured result of said temperatures,
    wherein heating occurs during a temperature-rising time period having a plurality of time period increments for each one of the plurality of regions, each one of the plurality of time period increments being associated with a range of temperature tolerances within which the temperature associated with a particular time period increment is maintained.

3. A semiconductor wafer heat treatment method of heating a semiconductor wafer, comprising the steps of:

placing a semiconductor wafer on a heating plate, and measuring temperatures when heating said semiconductor wafer at portions divided into a plurality of regions, and heating said semiconductor wafer while controlling, for each of said plurality of regions, the temperature when heating said semiconductor wafer, in accordance with a measured result of said temperatures wherein heating occurs during a temperature-rising time period having a plurality of time period increments for each one of the plurality of regions, each one of the plurality of time period increments being associated with a range of temperature tolerances within which the temperature associated with a particular time period increment is maintained.

4. A semiconductor wafer heat treatment method of heating a semiconductor wafer and then cooling it, including the steps of:

placing a semiconductor wafer equivalent heated to a predetermined temperature on a cooling plate, and measuring temperatures when cooling said semiconductor wafer equivalent, at portions divided into a plurality of regions;

placing a semiconductor wafer on a heating plate, and heating said semiconductor wafer to said predetermined temperature; and placing the semiconductor wafer heated to said predetermined temperature on said cooling plate, and cooling said semiconductor wafer while controlling, for each of said plurality of regions, the temperature when cooling said semiconductor wafer, in accordance with a measured result of said temperatures, wherein heating occurs during a temperature-rising time period having a plurality of temperature-rising time period increments for each one of the plurality of regions, each one of the plurality of temperature-rising time period increments being associated with a range of temperature tolerances within which the temperature associated with a particular temperature-rising time period increment is maintained and wherein cooling occurs during a temperature-lowering time period having a plurality of temperature-lowering time period increments for each one of the plurality of regions, each one of the plurality of temperature-lowering time period increments being associated with a range of temperature tolerances within which the temperature associated with a particular temperature-lowering time period increment is maintained.

5. A semiconductor wafer heat treatment method of heating a semiconductor wafer and then cooling it, including the steps of:

placing a semiconductor wafer on a heating plate, and heating said semiconductor wafer to a predetermined temperature; and placing said semiconductor wafer heated to said predetermined temperature on a cooling plate, and measuring temperatures when cooling said semiconductor wafer, at portions divided into a plurality of regions, and then cooling said semiconductor wafer while controlling, for each of said plurality of regions, the temperature when cooling said semiconductor wafer, in accordance with a measured result of said temperature, wherein heating occurs during a temperature-rising time period having a plurality of temperature-rising time period increments for each one of the plurality of regions, each one of the plurality of temperature-rising time period increments being associated with a range of temperature tolerances within which the temperature associated with a particular temperature-rising time period increment is maintained and wherein cooling occurs during a temperature-lowering time period having a plurality of temperature-lowering time period increments for each one of the plurality of regions, each one of the plurality of temperature-lowering time period increments being associated with a range of temperature tolerances within which the temperature associated with a particular temperature-lowering time period increment is maintained.

6. A semiconductor wafer heat treatment method of heating a semiconductor wafer and then cooling it, including the steps of:

placing a semiconductor wafer on a heating plate, and heating said semiconductor wafer while performing a temperature control on each region; and placing said heated semiconductor wafer on a cooling plate, and cooling said semiconductor wafer while performing a temperature control on each region wherein heating occurs during a temperature-rising time period having a plurality of temperature-rising time period increments for each one of the plurality of regions, each one of the plurality of temperature-rising time period increments being associated with a range of temperature tolerances within which the temperature associated with a particular temperature-rising time period increment is maintained and wherein cooling occurs during a temperature-lowering time period having a plurality of temperature-lowering time period increments for each one of the plurality of regions, each one of the plurality of temperature-lowering time period increments being associated with a range of temperature tolerances within which the temperature associated with a particular temperature-lowering time period increment is maintained.

7. The semiconductor wafer heat treatment method according to claim 6, wherein the temperature control in said heating and cooling steps is carried out such that an integration value of the temperatures in the respective regions of said semiconductor wafer is within an allowable value.

8. The semiconductor wafer heat treatment method according to claim 6, wherein the temperature control of said semiconductor wafer in said heating step is carried out in accordance with a measured result of temperatures in respective regions of a semiconductor wafer equivalent placed on said heating plate.

9. The semiconductor wafer heat treatment method according to claim 6, wherein the temperature control of said semiconductor wafer in said cooling step is carried out in accordance with a measured result of temperatures in respective regions of a semiconductor wafer equivalent placed on said cooling plate.

* * * * *